United States Patent
Yoon et al.

(10) Patent No.: US 8,198,114 B2
(45) Date of Patent: Jun. 12, 2012

(54) VERTICAL NITRIDE SEMICONDUCTOR LIGHT EMITTING DIODE AND METHOD OF MANUFACTURING THE SAME

(75) Inventors: Sang Ho Yoon, Seongnam-si (KR); Su Yeol Lee, Seongnam-si (KR); Doo Go Baik, Suwon-si (KR); Seok Beom Choi, Daejeon (KR); Tae Sung Jang, Suwon-si (KR); Jong Gun Woo, Suwon-si (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 0 days.

(21) Appl. No.: 12/909,297

(22) Filed: Oct. 21, 2010

(65) Prior Publication Data

US 2011/0053298 A1    Mar. 3, 2011

Related U.S. Application Data

(62) Division of application No. 12/544,868, filed on Aug. 20, 2009, now Pat. No. 7,838,317, which is a division of application No. 11/692,568, filed on Mar. 28, 2007, now abandoned.

(30) Foreign Application Priority Data

Aug. 21, 2006  (KR) .................. 10-2006-0078617
Mar. 14, 2007  (KR) .................. 10-2007-0025229

(51) Int. Cl.
*H01L 21/56*   (2006.01)
(52) U.S. Cl. ...... 438/47; 438/46; 438/706; 257/E21.366
(58) Field of Classification Search .............. 438/46, 438/47, 706; 257/E21.366
See application file for complete search history.

(56) References Cited

U.S. PATENT DOCUMENTS

| | | | |
|---|---|---|---|
| 5,717,226 | A  | 2/1998  | Lee et al. |
| 6,900,473 | B2 | 5/2005  | Yoshitake et al. |
| 7,037,738 | B2 | 5/2006  | Sugiyama et al. |
| 7,154,123 | B2 | 12/2006 | Kunisato et al. |
| 7,154,125 | B2 | 12/2006 | Koide et al. |

(Continued)

FOREIGN PATENT DOCUMENTS

JP        05-167101 A    7/1993

(Continued)

OTHER PUBLICATIONS

Fujii, T., Increase in the extraction efficiency of GaN-based light-emitting diodes via surface roughening, Applied Physics Letters, Feb. 9, 2004, pp. 855-857, vol. 84, No. 6.

(Continued)

*Primary Examiner* — Minchul Yang
(74) *Attorney, Agent, or Firm* — Lowe, Hauptman, Ham & Berner, LLP

(57) ABSTRACT

A vertical nitride-based semiconductor LED comprises a structure support layer; a p-electrode formed on the structure support layer; a p-type nitride semiconductor layer formed on the p-electrode; an active layer formed on the p-type nitride semiconductor layer; an n-type nitride semiconductor layer formed on the active layer; an n-electrode formed on a portion of the n-type nitride semiconductor layer; and a buffer layer formed on a region of the n-type nitride semiconductor layer on which the n-electrode is not formed, the buffer layer having irregularities formed thereon. The surface of the n-type nitride semiconductor layer coming in contact with the n-electrode is flat.

4 Claims, 4 Drawing Sheets

U.S. PATENT DOCUMENTS

| | | | |
|---|---|---|---|
| 7,294,519 | B2 | 11/2007 | Lee et al. |
| 7,838,317 | B2 * | 11/2010 | Yoon et al. ................ 438/47 |
| 2005/0104081 | A1 | 5/2005 | Kim et al. |
| 2005/0161693 | A1 * | 7/2005 | Sugiura et al. ............. 257/98 |
| 2005/0199891 | A1 | 9/2005 | Kunisato et al. |
| 2006/0003553 | A1 * | 1/2006 | Park et al. ................ 438/462 |
| 2007/0018183 | A1 | 1/2007 | Denbaars et al. |

FOREIGN PATENT DOCUMENTS

| | | |
|---|---|---|
| JP | 2005-072585 A | 3/2005 |
| JP | 2005150675 A | 6/2005 |
| JP | 2005-197573 A | 7/2005 |
| KR | 1020050092575 A | 9/2005 |
| KR | 1020070008745 A | 1/2007 |
| TW | 200625674 A | 7/2006 |

OTHER PUBLICATIONS

Korean Intellectual Property Office Notice of Allowance issued Oct. 13, 2008.

Office Action issued for Taiwan Application No. 09619998 mailed Jul. 5, 2010.

Japanese Office Action for Application No. 2007-104242, issued Sep. 7, 2010.

Office Action for U.S. Appl. No. 12/909,204 mailed Mar. 22, 2011.

* cited by examiner

[FIG. 1]
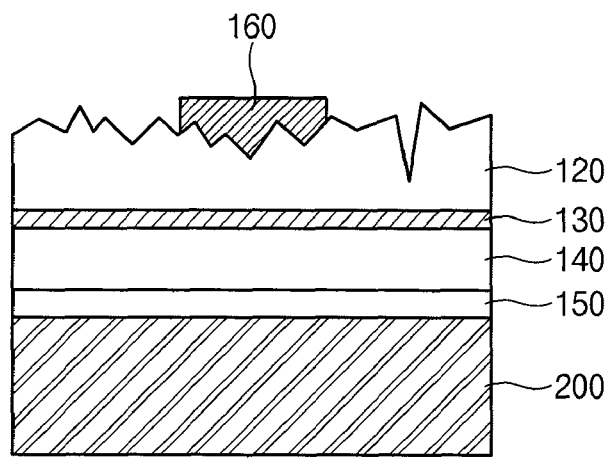
[FIG. 2]
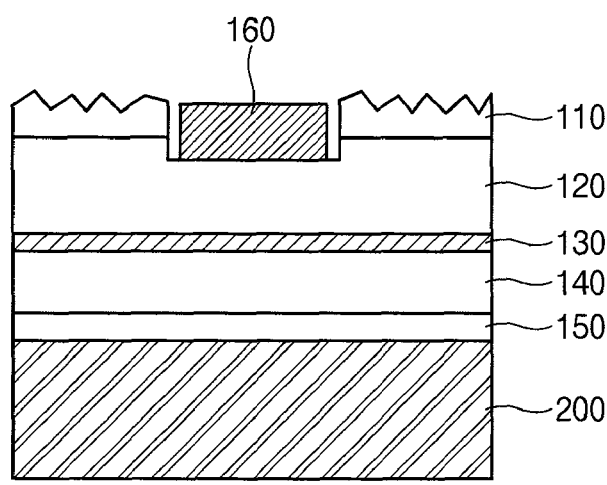
[FIG. 3A]
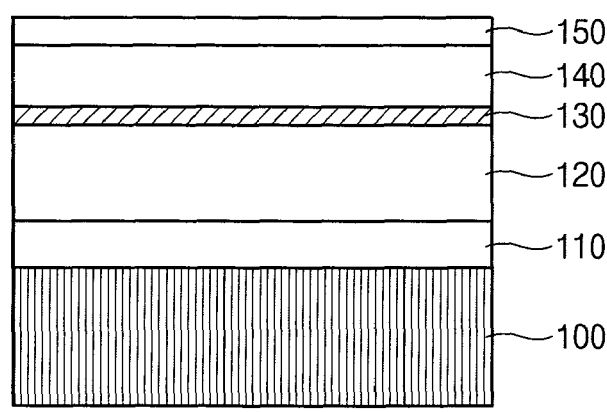

[FIG. 3B]
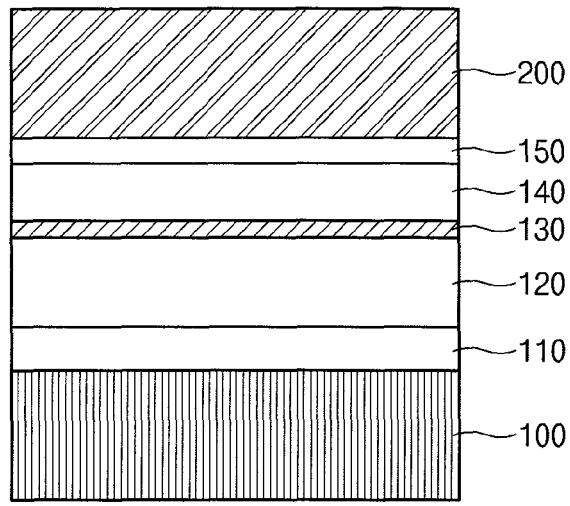
[FIG. 3C]
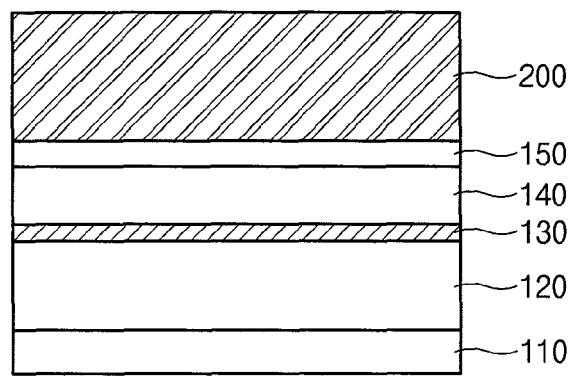
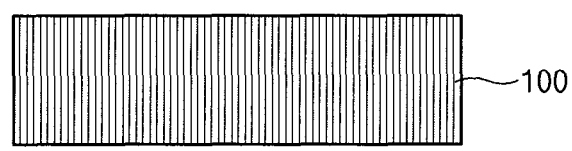
[FIG. 3D]
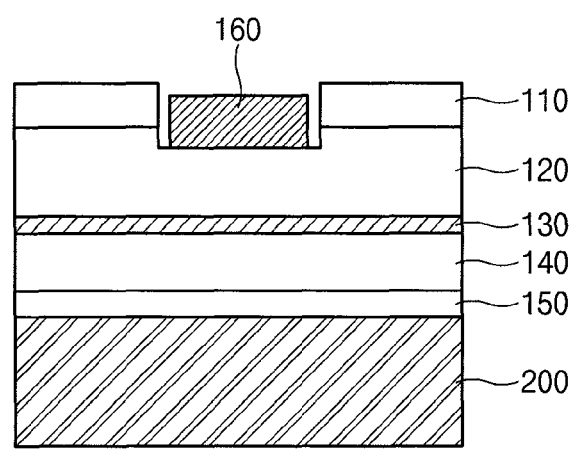

[FIG. 3E]
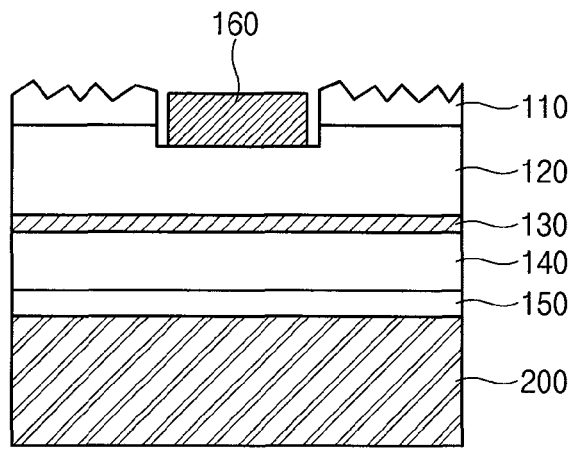
[FIG. 4A]
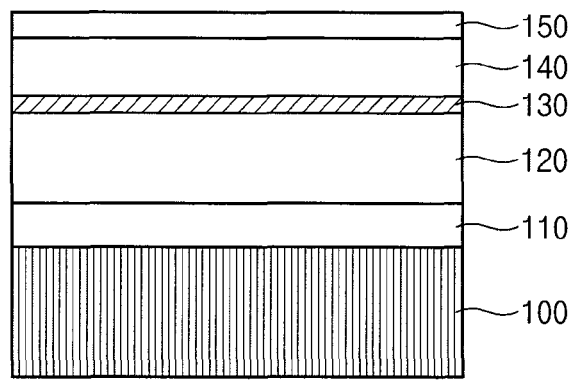
[FIG. 4B]
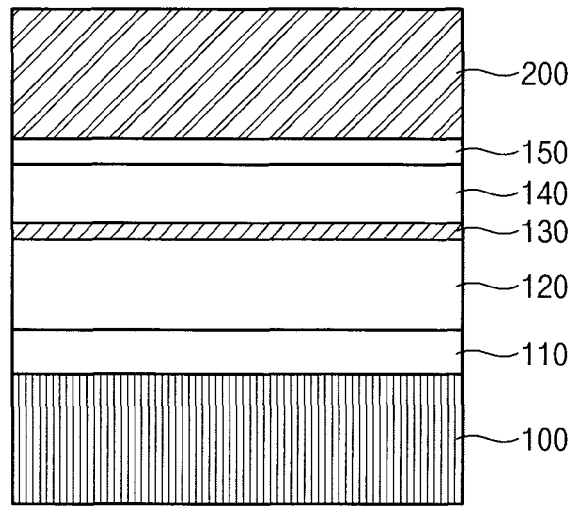

[FIG. 4C]
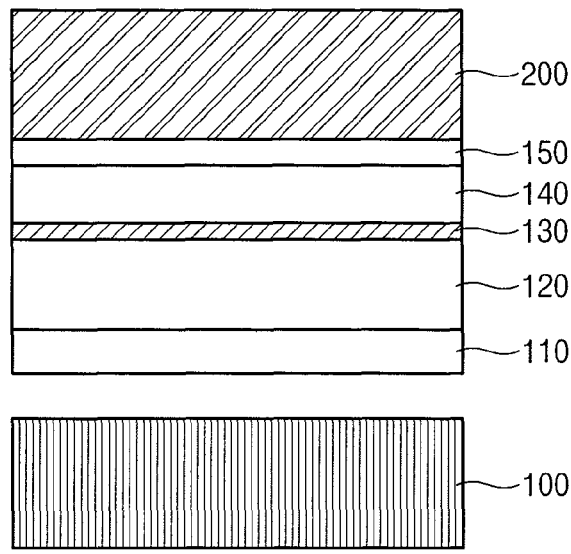
[FIG. 4D]
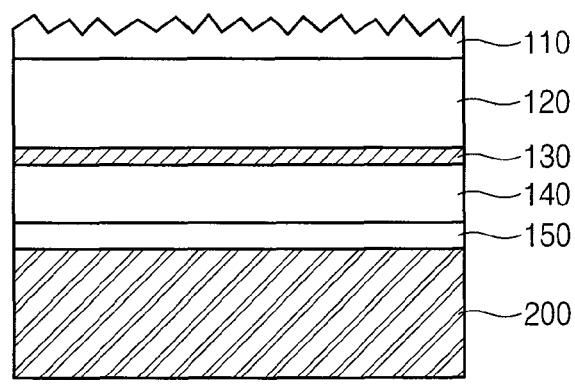
[FIG. 4E]
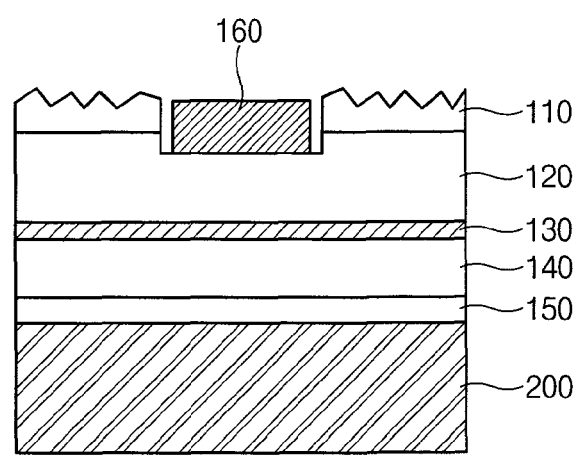

VERTICAL NITRIDE SEMICONDUCTOR LIGHT EMITTING DIODE AND METHOD OF MANUFACTURING THE SAME

RELATED APPLICATIONS

This application is a division of U.S. application Ser. No. 12/544,868, filed Aug. 20, 2009 now U.S. Pat. No. 7,838,317, which is a division of U.S. application Ser. No. 11/692,568, filed Mar. 28, 2007 now abandoned, which claims the benefit of Korean Patent Application No. 10-2006-0078617 filed with the Korean Intellectual Property Office on Aug. 21, 2006 and Patent Application No. 10-2007-0025229 filed with the Korean Intellectual Property Office on Mar. 14, 2007, the disclosures of which are incorporated herein by reference in their entirety.

This application is related to concurrently file application title "VERTICAL NITRIDE SEMICONDUCTOR LIGHT EMITTING DIODE AND METHOD OF MANUFACTURING THE SAME" by Sang Ho YOON, Su Yeol LEE, Doo Go BAIK, Seok Beom CHOI, Tae Sung JANG, and Jong Gun WOO, Ser. No. 12/909,204.

BACKGROUND OF THE INVENTION

1. Field of the Invention

The present invention relates to a vertical nitride semiconductor light emitting diode (LED) and a method of manufacturing the same, which can improve electrical and optical characteristics at the same time.

2. Description of the Related Art

Generally, a nitride-based semiconductor LED is grown on a sapphire substrate, but the sapphire substrate is a rigid nonconductor and has poor thermal conductivity. Therefore, there is a limitation in reducing the manufacturing costs by decreasing the size of a nitride-based semiconductor LED, or improving the optical output of power and chip characteristic. Particularly, because the application of a high current is essential for achieving high power LED, it is important to solve a heat-sink problem of the LED. To solve this problem, there has been proposed a vertical nitride-based LED in which a sapphire substrate is removed by using a laser lift-off (LLO) process.

Hereinafter, a conventional nitride-based semiconductor LED will be described in detail with reference to FIG. 1.

FIG. 1 is a sectional view illustrating the structure of the conventional nitride-based semiconductor LED.

As shown in FIG. 1, the nitride-based semiconductor LED has a structure support layer 200 formed in the lowermost portion thereof.

On the structure support layer 200, a positive electrode (p-electrode) 150 is formed. Preferably, the p-electrode 150 is formed of metal with high reflectance so as to serve as an electrode and a reflecting layer.

On the p-electrode 150, a p-type nitride semiconductor layer 140, an active layer 130, and an n-type nitride semiconductor layer 120 are sequentially formed.

On the surface of the n-type nitride semiconductor layer 120, irregularities for enhancing light extraction efficiency are formed. On the n-type nitride semiconductor layer 120 having the irregularities thereon, a negative electrode (n-electrode) 160 is formed.

In a method of manufacturing the conventional nitride-based semiconductor LED, a buffer layer (not shown), the n-type nitride semiconductor layer 120, the active layer 130, and the p-type nitride semiconductor layer 140 are sequentially formed on a sapphire substrate (not shown).

Generally, the buffer layer may not be doped with impurities or may be doped in low concentration. Alternately, the buffer layer may be formed with a laminated structure composed of a layer which is not doped with impurities and a layer doped in low concentration. Further, the n-type nitride semiconductor layer 120 is doped with impurities in high concentration.

Then, the p-electrode 150 and the structure support layer 200 are sequentially formed on the p-type nitride semiconductor layer 140. Then, the sapphire substrate is removed through an LLO (laser lift-off) process so as to expose the buffer layer.

Then, the buffer layer and the n-type nitride semiconductor layer 120 are etched so that irregularities are formed on the surface of the n-type nitride semiconductor layer 120. At this time, the etching is performed so that the buffer layer does not remain on the n-type nitride semiconductor layer 120. That is because the highly-doped n-type nitride semiconductor layer 120 should be caused to come in contact with the subsequent n-electrode 160, thereby reducing contact resistance of the n-electrode 160 and an operation voltage.

However, in the process where the etching is performed so that the irregularities are formed on the surface of the n-type nitride semiconductor layer 120, when the depth of etching is not properly controlled, for example, when even the buffer layer 130 is etched, a short-circuit defect occurs, thereby reducing an electrical characteristic of an LED.

To solve this problem, a highly-doped n-type nitride semiconductor layer 120 is formed to have a large thickness such that an etching margin is secured. However, this method degrades a characteristic of the active layer 130. Further, although etching is performed without a short-circuit defect, it is difficult to form the n-electrode 160 on the surface having irregularities formed thereon. Further, an electric current is crowded into the irregular-surface structure in the lower portion of the n-electrode 160, thereby reducing a life span of an LED.

There is provided another method. In this method, a sapphire substrate is removed through an LLO process so as to expose a buffer layer, irregularities are formed on the buffer layer through a wet-etching process, a region of the buffer layer in which an n-electrode is formed is etched so as to expose the n-type nitride semiconductor layer, and the n-electrode is formed on the exposed n-type nitride semiconductor layer. In this case, since the forming of the irregularities is performed before the forming of the n-electrode, damage of the n-electrode caused by the forming of the irregularities can be prevented. However, the irregular profile on the surface of the buffer layer can be reflected on the surface of the n-type nitride semiconductor layer as it is. Therefore, it is difficult to form the n-electrode on a flat surface, and it is not easy to control the depth of etching.

SUMMARY OF THE INVENTION

An advantage of the present invention is that it provides a vertical nitride semiconductor LED and a method of manufacturing the same, in which the surface of an n-type nitride semiconductor layer coming in contact with an n-electrode is flatten and the depth of etching for forming irregularities is easily adjusted, thereby improving electrical and optical characteristics of an LED at the same time.

Additional aspect and advantages of the present general inventive concept will be set forth in part in the description which follows and, in part, will be obvious from the description, or may be learned by practice of the general inventive concept.

According to an aspect of the invention, a vertical nitride-based semiconductor LED comprises a structure support layer; a p-electrode formed on the structure support layer; a p-type nitride semiconductor layer formed on the p-electrode; an active layer formed on the p-type nitride semiconductor layer; an n-type nitride semiconductor layer formed on the active layer; an n-electrode formed on a portion of the n-type nitride semiconductor layer; and a buffer layer formed on a region of the n-type nitride semiconductor layer on which the n-electrode is not formed, the buffer layer having irregularities formed thereon. The surface of the n-type nitride semiconductor layer coming in contact with the n-electrode is flat.

According to another aspect of the invention, a method of manufacturing a vertical nitride-based semiconductor LED comprises sequentially forming a buffer layer, an n-type nitride semiconductor layer, an active layer, and a p-type nitride semiconductor layer on a substrate; forming a p-electrode on the p-type nitride semiconductor layer; forming a structure support layer on the p-electrode; removing the substrate through an LLO process; selectively etching a portion of the buffer layer, on which the substrate is removed, so as to flatly expose a portion of the n-type nitride semiconductor layer; forming an n-electrode on the flatly-exposed n-type nitride semiconductor layer; and forming irregularities on the surface of the buffer layer which is not etched.

According to a further aspect of the invention, in the etching of the buffer layer, a dry-etching process is used.

According to a still further aspect of the invention, a method of manufacturing a vertical nitride-based semiconductor LED comprises sequentially forming a buffer layer, an n-type nitride semiconductor layer, an active layer, and a p-type nitride semiconductor layer on a substrate; forming a p-electrode on the p-type nitride semiconductor layer; forming a structure support layer on the p-electrode; removing the substrate through an LLO process; selectively etching a portion of the buffer layer, on which the substrate is removed, so as to flatly expose a portion of the n-type nitride semiconductor layer; forming irregularities on the surface of the buffer layer which is not etched; and forming an n-electrode on the flatly-exposed n-type nitride semiconductor layer.

According to a still further aspect of the invention, in the etching of the buffer layer, a dry-etching process is used.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a sectional view illustrating the structure of a conventional nitride-based semiconductor LED;

FIG. 2 is a sectional view of a vertical nitride-based semiconductor LED according to an embodiment of the invention;

FIGS. 3A to 3E are sectional views sequentially showing a process for explaining a method of manufacturing a vertical nitride-based semiconductor LED according to an embodiment of the invention; and FIGS. 4A to 4E are sectional views sequentially showing a process for explaining a method of manufacturing a vertical nitride-based semiconductor LED according to a modification of the invention.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures. In the drawings, the thicknesses of layers and regions are exaggerated for clarity.

Hereinafter, embodiments of the present invention will be described in detail with reference to the accompanying drawings.

Vertical Nitride-Based Semiconductor LED

First, a vertical nitride-based semiconductor LED according to an embodiment of the invention will be described with reference to FIG. 2.

FIG. 2 is a sectional view of the vertical nitride-based semiconductor LED according to an embodiment of the invention.

As shown in FIG. 2, the vertical nitride-based semiconductor LED has a structure support layer 200 formed in the lowermost portion thereof, the structure support layer 200 serving as a support layer and electrode of the LED.

On the structure support layer 200, a p-electrode 150 is formed. Preferably, the p-electrode 150 is formed of metal with high reflectance so as to serve as an electrode and a reflecting layer.

On the p-electrode 150, a p-type nitride semiconductor layer 140, an active layer 130, and an n-type nitride semiconductor layer 120 are sequentially formed.

The n-type and p-type nitride semiconductor layer 120 and 140 and the active layer 130 may be formed of a semiconductor material having a compositional formula of $Al_yIn_xGa_{(1-x-y)}N$ (here, $0 \leq x \leq 1$, $0 \leq y \leq 1$, and $0 \leq x+y \leq 1$) and can be formed through a well-known nitride deposition process such as MOCVD (Metal Organic Chemical Vapor Deposition) or MBE (Molecular Beam Epitaxy). More specifically, the n-type nitride semiconductor layer 120 may be formed of a GaN layer or GaN/AlGaN layer doped with n-type impurities. As for the n-type impurities, Si, Ge, Sn and the like are used. The p-type nitride semiconductor layer 140 may be formed of a GaN layer or GaN/AlGaN layer doped with p-type impurities. As for the p-type impurities, Mg, Zn, Be and the like are used.

On a portion of the n-type nitride semiconductor layer 120, an n-electrode 160 is formed. On the n-type nitride semiconductor layer 120 where the n-electrode 160 is not formed, a buffer layer 110 is formed.

Generally, the buffer layer 110 may not be doped with impurities or may be doped in low concentration. Alternately, the buffer layer 110 may be formed with a laminated structure composed of a layer which is not doped with impurities and a layer doped in low concentration. Further, the n-type nitride semiconductor layer 120 is doped with impurities in high concentration.

In the vertical nitride-based semiconductor LED according to this embodiment, irregularities for enhancing light extraction efficiency of the LED are formed on the buffer layer 110, and the surface of the n-type nitride semiconductor layer 120 coming in contact with the n-electrode 160 is flattened.

As described above, in the vertical nitride-based semiconductor LED, surface irregularities for enhancing light extraction efficiency of the LED are formed, and the n-electrode 160 is stably formed on the flat n-type nitride semiconductor layer 120. Therefore, it is possible to improve electrical and optical characteristics of the LED at the same time.

Method of Manufacturing Vertical Nitride-Based Semiconductor LED

Hereinafter, a method of manufacturing a vertical nitride-based semiconductor LED according to an embodiment of the invention will be described in detail with reference to FIGS. 3A to 3E.

FIGS. 3A to 3E are sectional views sequentially showing a process for explaining the method of manufacturing a vertical nitride-based semiconductor LED according to an embodiment of the invention.

First, as shown in FIG. 3A, a buffer layer 110, an n-type nitride semiconductor layer 120, an active layer 130, and a p-type nitride semiconductor layer 140 are sequentially formed on a substrate 100.

Preferably, the substrate 100 is formed of a transparent material containing sapphire. In addition to sapphire, the substrate 100 may be formed of zinc oxide (ZnO), gallium nitride (GaN), silicon carbide (SiC), or aluminum nitride (AlN).

As described above, the n-type and p-type nitride semiconductor layer 120 and 140 and the active layer 130 may be formed of a semiconductor material having a compositional formula of $Al_yIn_xGa_{(1-x-y)})N$ (here, $0 \leq x$, $0 \leq y$, and $x+y \leq 1$) and can be formed through a well-known nitride deposition process such as MOCVD (Metal Organic Chemical Vapor Deposition) or MBE (Molecular Beam Epitaxy). More specifically, the n-type nitride semiconductor layer 120 may be formed of a GaN layer or GaN/AlGaN layer doped with n-type impurities. As for the n-type impurities, Si, Ge, Sn and the like are used. The p-type nitride semiconductor layer 140 may be formed of a GaN layer or GaN/AlGaN layer doped with p-type impurities. As for the p-type impurities, Mg, Zn, Be and the like are used.

The buffer layer 110 is grown so as to enhance lattice matching between the substrate 100 and the n-type nitride semiconductor layer 120. Generally, the buffer layer 110 may not be doped with impurities or may be doped in low concentration. Alternately, the buffer layer 110 may be formed with a laminated structure composed of a layer which is not doped with impurities and a layer doped in low concentration. Further, the n-type nitride semiconductor layer 120 is doped with impurities in high concentration.

Next, on the p-type nitride semiconductor layer 140, a p-electrode 150 is formed. Preferably, the p-electrode 150 is formed of metal with high reflectance so as to serve as an electrode and a reflecting layer.

Subsequently, a structure support layer 200 is formed on the p-electrode 150, as shown in FIG. 3B.

Next, as shown in FIG. 3C, the substrate 100 is removed through an LLO (laser lift-off) process such that the surface of the buffer layer 110 is exposed.

Then, as shown in FIG. 3D, a portion of the buffer layer 110 on which the substrate 100 has removed is selectively etched so that a portion of the n-type nitride semiconductor layer 120 is flatly exposed. At this time, it is preferable that the etching process for exposing a portion of the n-type semiconductor layer 120 is performed through a dry-etching process. The reason why a portion of the buffer layer 110 is etched so as to expose the n-type nitride semiconductor layer 120 is that the n-type nitride semiconductor layer 120 is caused to come in contact with the subsequent n-electrode 160, thereby reducing contact resistance of the n-electrode 160 and an operation voltage.

Immediately after the substrate 100 is removed, the surface of the buffer layer 110 is relatively flat. Further, when a dry-etching process is performed on the buffer layer 110 with a flat surface, the depth of etching is easily controlled, and a flatly-etched surface is obtained.

After that, the n-electrode 160 is formed on the n-type nitride semiconductor layer 120 which is flatly exposed.

As such, since the n-electrode 160 is formed on the highly-doped n-type nitride semiconductor layer 120, low contact resistance and operation voltage can be obtained. Further, in the related art, the n-electrode 160 is formed on an irregular-surface structure, but in the invention, the n-electrode 160 is formed on the flat surface. Therefore, it is possible to prevent a current crowding effect caused by the irregular-surface structure, thereby increasing a life span of the LED.

Next, as shown in FIG. 3E, irregularities for enhancing light extraction efficiency is formed on the surface of the buffer layer 110 which has not been etched. The irregularities may be formed through a wet-etching process using KOH or the like.

In the related art, an etching process is performed so that irregularities are formed on the surface of the n-type nitride semiconductor layer 120. Therefore, the irregularities formation process for enhancing light extraction efficiency and the process for securing a low operation voltage are performed at the same time. In the present invention, however, only a portion of the n-type nitride semiconductor layer 120, on which the n-electrode 160 is to be formed, is flatly exposed. Then, the irregularities are formed on only the surface of the buffer layer 110 excluding the formation region of the n-electrode 160. That is, the forming of the n-electrode 160 and the forming of the irregularities are performed separately, so that the manufacturing process can be performed in a state where electrical and optical characteristics of an LED are optimized.

Meanwhile, the n-electrode 120 formed on the flatly-exposed n-type nitride semiconductor layer 120 may be formed before the irregularities are formed on the surface of the buffer layer 110. However, the n-electrode 120 may be formed after the irregularities are formed on the surface of the buffer layer 110.

As described above, the substrate 100 is removed through the LLO process, and a region of the buffer layer 110 in which the n-electrode 160 is to be formed is dry-etched so as to flatly expose a portion of the n-type nitride semiconductor layer 120. Then, the irregularities are formed on only the surface of the buffer layer 110 which has not been etched. Therefore, it is possible to improve electrical and optical characteristics of an LED at the same time.

Modification of Method of Manufacturing Vertical Nitride-Based Semiconductor LED Hereinafter, a method of manufacturing vertical nitride-based semiconductor LED according to a modification of the invention will be described in detail with reference to FIGS. 4A to 4E. The descriptions of the same portions as those of the method of manufacturing a vertical nitride-based semiconductor LED according to the embodiment will be omitted.

FIGS. 4A to 4E are sectional views sequentially showing a process for explaining the method of manufacturing a vertical nitride-based semiconductor LED according to the modification of the invention. The process shown in FIGS. 4A to 4B is performed in the same manner as the process shown in FIGS. 3A to 3E.

That is, as shown in FIGS. 4A to 4C, a buffer layer 110, an n-type nitride semiconductor layer 120, an active layer 130, a p-type nitride semiconductor layer 140, and a p-electrode 150 are sequentially formed on a substrate (FIG. 4A). Then, a structure support layer 200 is formed on the p-electrode 150 (FIG. 4B), and the substrate 100 is removed by an LLO process such that the surface of the buffer layer 110 is exposed (FIG. 4C).

The modification of the invention is different from the embodiment of the invention in that irregularities for enhancing light extraction efficiency are formed on the entire surface of the buffer layer 110 where the substrate 110 has been removed, and a portion of the buffer layer 110 having the irregularities formed thereon is selectively etched so that a portion of the n-type nitride semiconductor layer 120 is flatly exposed, as shown in FIGS. 4D and 4E. That is, in the embodiment, the etching of the buffer layer 110 is performed before the forming of the irregularities is performed, but in the modification, the forming of the irregularities is performed before the etching of the buffer layer 110 is performed.

On the n-type nitride semiconductor layer 120 which is flatly exposed through the above-described process, an n-electrode 160 is formed.

Similar to the embodiment, the irregularities formed on the entire surface of the buffer layer 110 may be formed through a wet-etching process using KOH as an etching solution. Further, in order to expose a portion of the n-type nitride semiconductor layer 120, it is preferable that the buffer layer 110 is dry-etched.

The modification may be disadvantageous comparing with the embodiment in that a dry-etching should be performed on the buffer layer 110 having the irregularities formed thereon. However, the modification is more advantageous than the embodiment in that a wet-etching process which is more difficult to precisely control than a dry-etching process is performed on the entire surface of the buffer layer 110 where the substrate 100 has been removed.

Similar to the described-above embodiment, the forming of the n-electrode 160 and the forming of the irregularities are performed separately, so that electrical and optical characteristics of an LED can be improved at the same time.

According to the vertical nitride-based semiconductor LED and the method of manufacturing the same, the forming of the n-electrode and the forming of the irregularities are performed separately. Therefore, while the surface of the n-type nitride semiconductor layer coming in contact with the n-electrode is flatly formed, the depth of etching for forming irregularities can be easily controlled.

Therefore, it is possible to improve electrical and optical characteristics of an LED at the same time.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of manufacturing a vertical semiconductor LED, said method comprising:
   sequentially forming a buffer layer, a first semiconductor layer, an active layer, and a second semiconductor layer on a substrate;
   forming a second electrode on the second semiconductor layer;
   forming a structure support layer on the second electrode;
   removing the substrate through an LLO (Laser Lift-Off) process;
   selectively etching a portion of the buffer layer, from which the substrate is removed, so as to expose a substantially flat portion of the first semiconductor layer;
   forming irregularities by etching the unetched portion of the buffer layer; and
   forming a first electrode on the exposed substantially flat portion of the first semiconductor layer.

2. The method according to claim 1, wherein in the etching of the buffer layer to expose the substantially flat portion of the first semiconductor layer, a dry-etching process is used.

3. A method of manufacturing a vertical semiconductor LED, said method comprising:
   sequentially forming a buffer layer, a first semiconductor layer, an active layer, and a second semiconductor layer on a substrate;
   forming a second electrode on the second semiconductor layer;
   forming a structure support layer on the second electrode;
   removing the substrate through an LLO (Laser Lift-Off) process;
   forming irregularities by etching the entire surface of the buffer layer, from which the substrate is removed;
   selectively etching a portion of the buffer layer, on which the irregularities are formed, so as to expose a substantially flat portion of the first semiconductor layer; and
   forming a first electrode on the exposed substantially flat portion of the first semiconductor layer.

4. The method according to claim 3, wherein in the etching of the portion of the buffer layer, a dry-etching process is used.

* * * * *